United States Patent [19]
Lobdill et al.

[11] Patent Number: 5,285,012
[45] Date of Patent: Feb. 8, 1994

[54] LOW NOISE INTEGRATED CIRCUIT PACKAGE

[75] Inventors: Richard R. Lobdill, San Luis Obispo, Calif.; Richard A. Levis, Chicago, Ill.

[73] Assignee: Axon Instruments, Inc., Foster City, Calif.

[21] Appl. No.: 837,843

[22] Filed: Feb. 18, 1992

[51] Int. Cl.⁵ .............................................. H01L 23/02
[52] U.S. Cl. ................... 174/52.4; 257/690; 257/704
[58] Field of Search .............. 174/52.1, 52.2, 52.3, 174/52.4, 51, 35 R, 35 MS; 357/74, 72; 257/659, 660, 665, 690, 693, 704; 361/392, 393, 394, 395, 424

[56] References Cited
U.S. PATENT DOCUMENTS

| | | |
|---|---|---|
| 3,209,216 | 9/1965 | Langridge et al. |
| 3,243,862 | 4/1966 | Csakvari |
| 3,312,771 | 4/1967 | Hessinger et al. |
| 3,404,215 | 10/1968 | Burks et al. |
| 3,618,203 | 11/1971 | Pryor |
| 3,981,069 | 9/1976 | Johansen ........................... 174/51 |
| 4,398,208 | 8/1983 | Murano et al. ..................... 257/704 |

FOREIGN PATENT DOCUMENTS 54-40578  3/1979  Japan ................................ 257/698

Primary Examiner—Leo P. Picard
Assistant Examiner—Bot Ledynh
Attorney, Agent, or Firm—Skjerven, Morrill, MacPherson, Franklin & Friel

[57] ABSTRACT

The present invention discloses a package for electronic components which reduces the unwanted electronic noise generated by the package and which can be fabricated by conventional manufacturing techniques. Accordingly, a lid for a package housing is fabricated from beryllium oxide and contains a small hole. During assembly, a wire attached to one of the electronic components is inserted through the hole of this lid, and the lid is attached by conventional methods. Finally, the wire protruding through the hole is soldered to the lid, which completes the sealing of the housing and which provides for a hermetic environment for the enclosed electronic components.

8 Claims, 3 Drawing Sheets

LOW NOISE INTEGRATED CIRCUIT PACKAGE

BACKGROUND OF THE INVENTION

1. Field of the Invention

This invention relates generally to the field of electronic component packaging, and more particularly to packaging for integrated circuits which can provide a low noise circuit environment.

2. Description of Prior Art

Packages for electronic circuit components provide the mechanical protection so that these components may be easily handled. Of necessity all packages must provide electrical leads or feed-throughs to connect the components within the package to the electronic system outside the package. These leads are usually arranged in several tightly spaced rows, and can typically be found either on two opposing sides of the package, on all four sides, or along the bottom of the package.

In previous packaging schemes, the dielectric which seals the leads of the package has had to serve a dual purpose. First, it must be workable during package construction such that it flows well around the leads and then cools with a hermetic seal without cracking. Secondly, the dielectric material should ideally produce a minimal amount of 'dielectric noise' which in some instances can degrade the performance of the electronic components inside the package. The effects of dielectric noise can be especially unwelcome for circuitry interacting with extremely small signal levels in a high impedance environment.

Unfortunately, the lowest noise dielectrics (e.g. diamond, sapphire, quartz, beryllium oxide, Corning 7070 glass) do not lend themselves to standard package construction techniques and therefore most packages compromise noise performance in order to form a more perfect seal.

As is well known in the art, a traditional hybrid integrated circuit (IC) package comprises a housing and a lid. The housing comprises a base and four sidewalls and is fabricated using plastic, ceramic, or metal, or a combination thereof. Electrical feed-throughs, or leads, pass through the base or sides of the housing in two or more tightly spaced rows. After the circuit components are attached inside the housing, either directly or first by being attached to a flat substrate material, the circuit components are connected together and to the electrical leads. Lastly, a flat lid is attached to the housing using one of several sealing methods, such as by soldering or by using an epoxy preform. All electrical connections are made through the housing using the feed-throughs which are isolated from the housing.

SUMMARY OF THE INVENTION

The object of the present invention is an integrated circuit package with low dielectric noise feedthroughs for one or more critical electrical signals. A further object of the present invention is a package which provides for a hermetic environment to the enclosed electronic components when assembled. A still further object of the present invention is a package which allows a first dielectric to be used for minimizing dielectric noise of critical leads, and a second dielectric to be used for sealing non-critical leads to the enclosure.

Accordingly, a lid for a package housing is fabricated from beryllium oxide and contains a small hole. During assembly, a wire attached to one of the electronic components is inserted through the hole of this lid, and then the lid is attached by conventional means. Finally, the wire protruding through the hole is soldered to the lid, which completes the sealing of the housing and which provides for a hermetic environment for the enclosed electronic components. The electrical properties of this feed-through passing through the lid are determined by the material of the lid, and not by the material of the housing, as are all other leads or feed-throughs. This invention provides for a rugged package fabricated using existing packaging technology such that very little unwanted electronic noise is generated by the packaging.

DETAILED DESCRIPTION OF THE INVENTION

Figure 1:
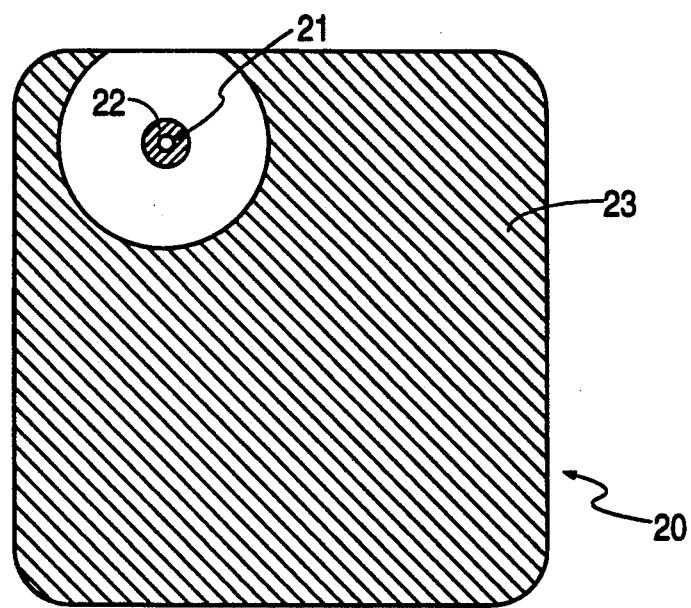
FIG. 1 is a top view of the lid of the present invention, showing the feed-through hole.

The electrical noise properties of a critical lead for a hybrid integrated circuit (IC) package can be improved by routing that lead through a modified lid comprised of a low dielectric noise material. FIG. 1 is a top view of a lid of the current invention, and shows a lid 20 with rounded corners which are typical of common prior art. Unlike the prior art, however, a hole 21 allows a wire to pass through lid 20 during assembly. Also shown is a pad 22 of conductive material which is screened onto lid 20 during manufacture. This pad 22 provides a suitable surface to solder onto, thereby attaching firmly such a wire to lid 20. Shield 23 is a further conductive area and is provided to cover the surface of lid 20 except around hole 21 and pad 22, and provides for electrical shielding as well blocking of ambient light. Shield 23 and pad 22 are formed by traditional thick-film methods. In the preferred embodiment, lid 20 is fabricated of beryllium oxide, BeO, chosen mainly for its low dielectric noise. Additionally, BeO is less transparent to light than other low noise dielectrics. Nonetheless, other dielectrics could be employed to advantage following the teaching of this invention.

Figure 2:
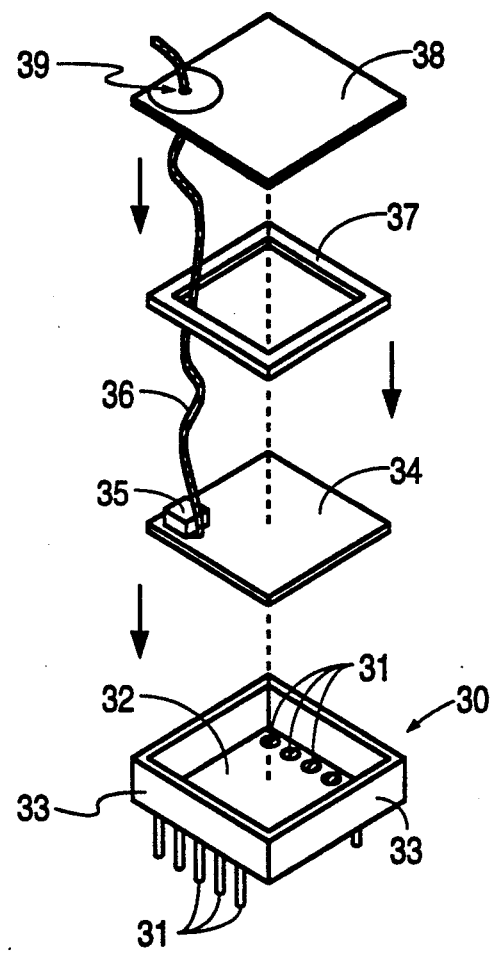
FIG. 2 is an isometric view of the present invention, showing the method of assembly of the housing, the lid, the electronic components already connected to a substrate, and the wire connected to one of these electronic components, which passes through the lid.

FIG. 2 highlights the assembly process of a hybrid package using the lid of FIG. 1. A housing 30 is comprised of a base 32, and four sidewalls 33, which together form a cavity into which electronic components are placed, usually by attachment to base 32. A plurality of leads 31 pass through base 32 and provide for insulated electrical feed-throughs. In this example, the leads 31 are arranged in two rows and protrude from base 32 of housing 30. In other embodiments, leads 31 may be arranged differently, or may pass through one or more sidewalls 33.

A substrate 34 is provided, as is common in the prior art, to mechanically support electronic components as well as to provide interconnection between these various electronic components. An electronic component 35 is shown attached to substrate 34. Other electronic components can be attached to substrate 34 and interconnected as is common in the art.

A wire 36 is attached to electronic component 35, and during the assembly process, is inserted through epoxy pre-form 37 and through hole 39 of lid 38. Lid 38 can be of any suitable material, but in the preferred embodiment, is fabricated of beryllium oxide, BeO, which is chosen for its low dielectric noise and lack of light transparency. BeO is also a common material which is usually used for substrates, such as substrate 34.

Figure 3:
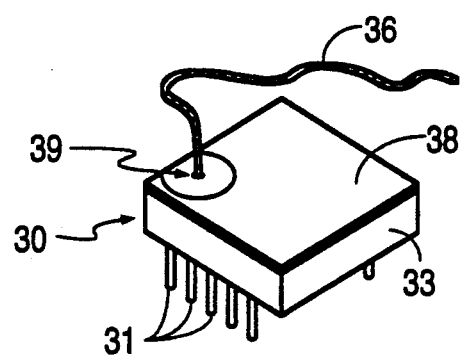
FIG. 3 is an isometric view of a completed hybrid package, showing the protruding wire which is soldered to the outside of the lid.

Lid 38 is attached to housing 30 in the traditional fashion using epoxy preform 37. After this operation, the package appears as in FIG. 3. Wire 36, still protruding out through hole 39 of lid 38, is then soldered to lid 38. This solder step completes the encapsulation of the electronic components and provides for a hermetic package.

As a result, while most electrical connections to the electronic components of the hybrid are through leads 31 passing through base 32 in the traditional fashion, one electrical connection uses wire 36 and passes instead through lid 38. This wire 36 provides for an extremely low noise circuit feed-through and arises from the low dielectric noise characteristics of BeO. Both the low capacitance and the low dissipation inherent in BeO are important features which give BeO such a low noise capability.

In a specific integrated circuit designed for low current measurement applications, the present invention reduced the noise contribution from the package by almost 50%. In this application, this reduction equates to an overall system noise reduction of about 15%.

While the preceding descriptions have discussed the present invention in terms of a hybrid integrated circuit package, these teachings can be equally applied to a monolithic integrated circuit package, or to any other similar electronic component package.

What is claimed is:

1. A package for electronic components comprising:
    a housing having leads passing through a material of the housing for making electrical connections to electronic components which may be mounted within said housing;
    a lid comprised of a material with lower dielectric noise than the material through which said leads of said housing pass; and
    means for making electrical connection to an electronic component which may be mounted within said housing through said lid.

2. The structure of claim 1 wherein said means for making electrical connection to such a mounted electronic component through said lid comprises a hole formed through said lid, said hole allowing the passage of a wire connected to such a mounted electronic component.

3. The structure of claim 2 and further comprising a wire connected to such a mounted electronic component, said wire passing through said hole formed through said lid.

4. The structure of claim 3 wherein said wire passing through said hole formed through said lid is bonded to said lid.

5. The structure of claim 4 wherein said hole formed through said lid is sealed to prevent the passage of gaseous vapors, liquids, and foreign materials.

6. The structure of claim 5 wherein said lid is substantially coated with a conductive layer, said conductive layer providing for a region of non-conductive area around said hole formed through said lid.

7. A package for containing electronic components and for providing electrical connection between the electronic components and an electronic system outside the package, the package having a lid comprising:
    an entry region to accommodate the presence of a conductive lead through the lid into the package for coupling to an electronic component therein;
    an insulating region comprising a low noise dielectric material and surrounding the entry region; and
    a shield region surrounding the insulating region;
    wherein the lid comprises a sheet of low-noise dielectric material, the shield region comprises a light-blocking material disposed on a surface of the lid and extending over the entire lid surface excluding an annular region surrounding the entry region, the insulating region comprising the annular region, and the entry region comprising a hole through the lid.

8. A package as in claim 7 wherein the entry region further comprises an annular region of a conductive material surrounding the hole for receiving solder when a conductive lead is present to retain the conductive lead and seal the entry region.

* * * * *